United States Patent
Pavani

(10) Patent No.: US 9,324,541 B1
(45) Date of Patent: Apr. 26, 2016

(54) CERTIFIED WAFER INSPECTION
(71) Applicant: Sri Rama Prasanna Pavani, Palo Alto, CA (US)
(72) Inventor: Sri Rama Prasanna Pavani, Palo Alto, CA (US)
(73) Assignee: Exnodes Inc., Palo Alto, CA (US)
( * ) Notice: Subject to any disclaimer, the term of this patent is extended or adjusted under 35 U.S.C. 154(b) by 0 days.
(21) Appl. No.: 14/547,111
(22) Filed: Nov. 18, 2014
(51) Int. Cl.
  G06K 9/00 (2006.01)
  H01J 37/26 (2006.01)
  H01J 37/20 (2006.01)
  H01J 37/22 (2006.01)
(52) U.S. Cl.
  CPC .............. *H01J 37/263* (2013.01); *H01J 37/20* (2013.01); *H01J 37/222* (2013.01); *H01J 2237/063* (2013.01); *H01J 2237/221* (2013.01); *H01J 2237/2602* (2013.01)
(58) Field of Classification Search
  USPC ................... 250/306, 307, 310, 311, 442.11, 250/376.09, 370.1, 526; 438/14, 16, 18, 438/800
  See application file for complete search history.

(56) References Cited

U.S. PATENT DOCUMENTS

| | | | | |
|---|---|---|---|---|
| 6,465,265 | B2 * | 10/2002 | Opsal | H01L 22/20 257/E21.525 |
| 6,646,737 | B2 * | 11/2003 | Tortonese | B82Y 35/00 356/243.1 |
| 6,897,445 | B2 * | 5/2005 | Nakada | H01J 37/265 250/442.11 |
| 7,009,178 | B2 * | 3/2006 | Nakada | H01J 37/265 250/310 |
| 2005/0173650 | A1 * | 8/2005 | Lower | B23K 15/00 250/397 |
| 2013/0051635 | A1 * | 2/2013 | Wu | G06K 9/00046 382/124 |
| 2014/0126801 | A1 * | 5/2014 | Callahan | G06K 9/0014 382/133 |
| 2014/0241494 | A1 * | 8/2014 | Spannuth | G01N 23/046 378/41 |

* cited by examiner

*Primary Examiner* — Bernard E Souw

(57) ABSTRACT

A method for certifying an inspection system using a calibrated surface, comprising: acquiring a calibrated list from said calibrated surface, with said calibrated list comprising information about features located on said calibrated surface; inspecting said calibrated surface with said inspection system to generate an estimated list, with said estimated list comprising information about features located on said calibrated surface; generating a matched list by searching for the presence of one or more calibrated features in said estimated list, wherein said calibrated features are listed in said calibrated list; computing an estimated characteristic parameter from said matched list, wherein said estimated characteristic parameter quantifies features in said matched list having a unifying characteristic; and comparing said estimated characteristic parameter with a calibrated characteristic parameter, wherein said calibrated characteristic parameter quantifies features in said calibrated list having said unifying characteristic, whereby the ability of said inspection system to detect features with one or more characteristics is certified. A system and method for imaging a surface to generate an adaptive resolution image, comprising: determining a weakly scattering feature, wherein said weakly scattering feature produces a weak image response to be resolved by said adaptive resolution image; determining a coarse spot size such that said weakly scattering feature is detected in an image captured with said coarse spot size; capturing a coarse image of region with said coarse spot size, wherein said coarse image of region comprises one or more pixels corresponding to a predetermined region of said surface; classifying said coarse image of region into a coarse image of feature and a coarse image of surface, wherein a feature is detected in said coarse image of feature and a feature is not detected in said coarse image of surface; estimating a feature position from said coarse image of feature, wherein said feature position is the location of feature on said surface; capturing a fine image of feature at said feature position, wherein said fine image of feature is captured with a fine spot size having a smaller spot size than said coarse spot size; and combining said fine image of feature and said coarse image of surface to generate said adaptive resolution image, whereby feature regions are captured with finer resolution than featureless surface regions in said adaptive resolution image.

20 Claims, 7 Drawing Sheets

CERTIFIED WAFER INSPECTION

FIELD OF THE INVENTION

This invention relates generally to wafer inspection and more particularly to certifying the performance of an inspection system with a calibrated wafer by using information obtained from adaptive resolution imaging.

BACKGROUND

Wafer inspection refers to inspecting semiconductor wafers for defects or abnormalities located on the surface of the wafer. Finding such defects is important for maximizing the production yield of integrated circuits (IC), where yield refers to the ratio of ICs that meet desired specifications to the total number of produced ICs. Maximizing yield is of outmost importance in semiconductor fabrication since yield determines the cost of an IC. Semiconductor fabrication comprises hundreds of intricate process steps that transform a bare semiconductor wafer into a number of ICs. Abnormalities or defects introduced in any of those process steps could result in a negative impact on yield. Therefore, semiconductor fabs employ wafer inspection tools to inspect wafers after each significant process step. Any abnormal increase in defects is immediately detected, reviewed, and analyzed to determine and eliminate the root cause of defects. In doing so, defects are prevented from propagating to multiple semiconductor wafers, leading to a containment of the negative impact on yield. Thus, yield is maximized by minimizing the negative impact of yield affecting defects.

However, maximizing yield is an increasingly challenging endeavor as the size of semiconductor nodes shrink. Shrinking of nodes, also called as node scaling, refers to the reduction in size of components of an IC with each next generation fabrication technology. Node scaling is the fundamental enabler for performance improvement (increased speed, reduced power, increased bandwidth, increased capacity) and cost reduction of ICs. Maintaining production yield as semiconductor fabrication inflects from one technology node to a next generation technology node is proving to be formidable challenge. This is primarily because of the inability of wafer inspection systems to improve at the same rate as node scaling. In the last ten years, while the smallest IC structures shrank from 130 nm to 14 nm (over 9× reduction), defect sensitivity of optical wafer inspection systems improved at a substantially slower rate from 50 nm to 20 nm (2.5× reduction). As a result, an increasing number of yield affecting defects pass undetected through wafer inspection systems, leading to a significant negative impact on yield.

Another reason for yield impact is because optical wafer inspection tools are designed primarily for detecting spherical particles, such as polystyrene latex (PSL) spheres or silicon dioxide (silica) spheres. The 50 nm to 20 nm improvement over the last decade corresponds to diameters of spherical particles. Remarkably, particles are only one of several defect types that can affect yield in semiconductor fabrication. Besides particles, defect types such as process induced defects, residues, crystalline originated particles, residues, and scratches can also cause a significant negative impact to production yield. The reason for the use of spherical particles is because light scattering from spherical particles can be easily modeled with techniques such as Mie scattering. As the shape of a defect deviates from a sphere, light scattering pattern of the defect also deviates from the light scattering pattern of a sphere. Therefore, an optical wafer inspection tool designed to maximize defect sensitivity for spherical particles may not be as sensitive for other defect shapes. For example, an optical wafer inspection tool specified to detect a 20 nm spherical particle may not be able to reliably detect a process induced defect having the same volume as the spherical particle. Unfortunately, such defects may pass completely undetected through wafer inspection systems, thereby having a negative impact on yield. Accordingly, there is a need for a method to certify the ability of a wafer inspection tool to detect diverse defects that could cause a negative impact on yield.

In a traditional wafer inspection procedure, optical wafer inspection is used for detecting the position and equivalent sizes of defects on wafers. If the number of defects, larger a predetermined defect size threshold, is higher than a predetermined defect count threshold value, defects on the wafer are considered to have the potential to affect yield. Such defects are reviewed with an electron microscope based defect review system. Reviewing refers to acquiring a high resolution image of a defect with an electron microscope. Since reviewing with an electron microscope is a very slow procedure compared to optical inspection, not all regions of the wafer are reviewed. To improve speed, the positions of defects captured with an optical inspection system are loaded into the electron microscope based review system, and high resolution images are captured only at those positions. While this shortcut improves speed, it simultaneously also opens up the possibility for defects not detected by optical wafer inspection system to pass through undetected in electron microscope based systems, even though the electron microscope based system has sufficient resolution to detect all yield affecting surface defects. Accordingly, there exists a stringent trade-off between speed of review and probability to capture defects.

Traditional wafer inspection suffers from the following problems: a) lack of a method to certify the ability of wafer inspection systems to detect diverse defect types; b) trade-off between speed of defect review and probability to capture defects.

Accordingly, there is a need for an improved wafer inspection method that can certify the ability of wafer inspection systems to detect diverse defect types; and relax the trade-off between speed of defect review and the probability to capture defects.

SUMMARY

The invention is a method for certifying the performance of an inspection system with a calibrated wafer by using a calibrated list obtained from adaptive resolution imaging.

In some embodiments, the invention is a method for certifying an inspection system using a calibrated surface, comprising: acquiring a calibrated list from said calibrated surface, with said calibrated list comprising information about features located on said calibrated surface; inspecting said calibrated surface with said inspection system to generate an estimated list, with said estimated list comprising information about features located on said calibrated surface; generating a matched list by searching for the presence of one or more calibrated features in said estimated list, wherein said calibrated features are listed in said calibrated list; computing an estimated characteristic parameter from said matched list, wherein said estimated characteristic parameter quantifies features in said matched list having a unifying characteristic; and comparing said estimated characteristic parameter with a calibrated characteristic parameter, wherein said calibrated characteristic parameter quantifies features in said calibrated list having said unifying characteristic, whereby the ability of said inspection system to detect features with one or more characteristics is certified.

In some embodiments, the invention is a method for imaging a surface to generate an adaptive resolution image, comprising: determining a weakly scattering feature, wherein said weakly scattering feature produces a weak image response to be resolved by said adaptive resolution image; determining a coarse spot size such that said weakly scattering feature is detected in an image captured with said coarse spot size; capturing a coarse image of region with said coarse spot size, wherein said coarse image of region comprises one or more pixels corresponding to a predetermined region of said surface; classifying said coarse image of region into a coarse image of feature and a coarse image of surface, wherein a feature is detected in said coarse image of feature and a feature is not detected in said coarse image of surface; estimating a feature position from said coarse image of feature, wherein said feature position is the location of feature on said surface; capturing a fine image of feature at said feature position, wherein said fine image of feature is captured with a fine spot size having a smaller spot size than said coarse spot size; and combining said fine image of feature and said coarse image of surface to generate said adaptive resolution image, whereby feature regions are captured with finer resolution than featureless surface regions in said adaptive resolution image.

In some embodiments, the invention is a system for imaging a surface to generate an adaptive resolution image, comprising: an imaging module for capturing an image of a region of said surface, with said imaging module having two or more spot sizes; a processor configured to: determine a weakly scattering feature, wherein said weakly scattering feature produces a weak image response to be resolved by said adaptive resolution image; determine a coarse spot size such that said weakly scattering feature is detected in an image captured with said coarse spot size; acquire a coarse image of region with said coarse spot size, wherein said coarse image of region comprises one or more pixels corresponding to a predetermined region of said surface; classify said coarse image of region into a coarse image of feature and a coarse image of surface, wherein a feature is detected in said coarse image of feature and a feature is not detected in said coarse image of surface; estimate a feature position from said coarse image of feature, wherein said feature position is the location of feature on said surface; capture a fine image of feature at said feature position, wherein said fine image of feature is captured with a fine spot size having a smaller spot size than said coarse spot size; and combine said fine image of feature and said coarse image of surface to generate an adaptive resolution image, whereby feature regions are captured with finer resolution than featureless surface regions in said adaptive resolution image.

DETAILED DESCRIPTION OF THE PREFERRED EMBODIMENTS

Figure 1:
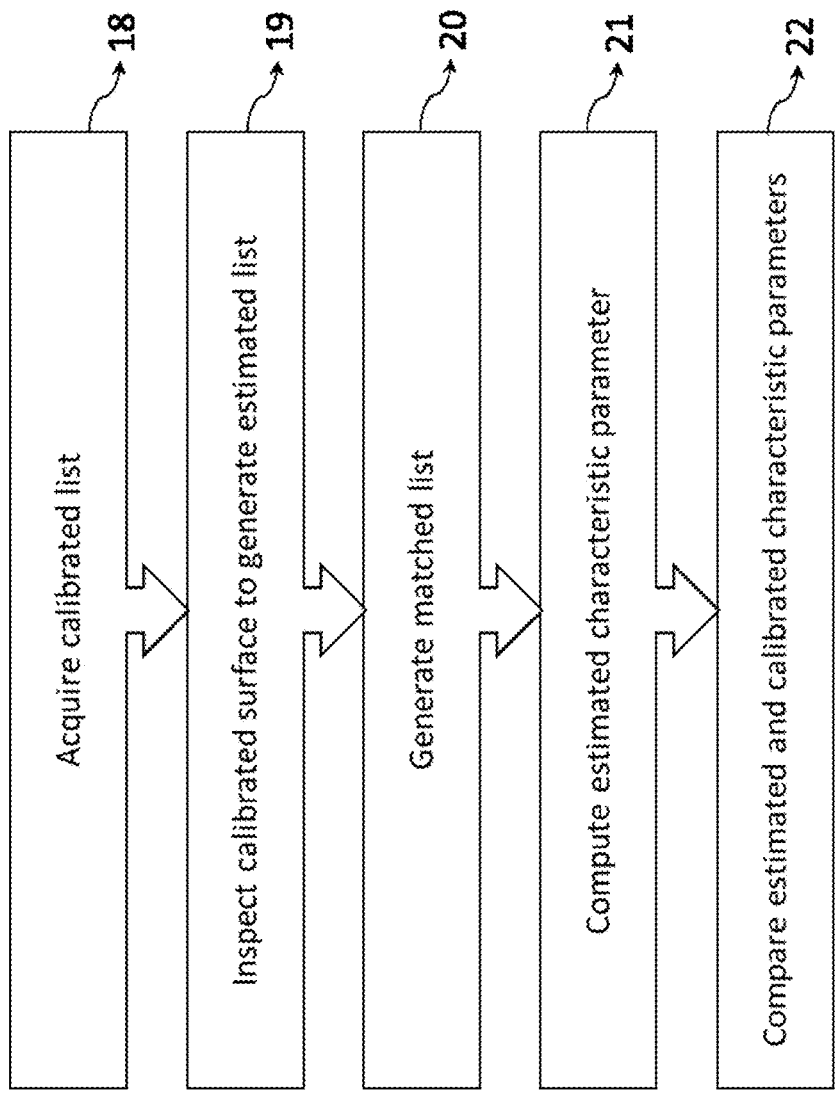
FIG. 1 illustrates an exemplary flow chart to calibrate a wafer inspection system using a calibrated surface, in accordance with the invention.

FIG. 1 illustrates an exemplary flow chart to calibrate a wafer inspection system using a calibrated surface, in accordance with the invention. In block 18, a calibrated list is acquired. A calibrated list comprises information about features on the calibrated surface. Features include abnormalities or defects and other structures present on the calibrated surface. Abnormalities or defects include particles, process induced defects, crystal originated pits, residues, scratches, and bumps. In some embodiments, the calibrated list comprises information on position of features. Position information refers to the location of features on the calibrated surface. In some embodiments, position information comprises two dimensional Cartesian coordinate locations (x,y) of features. In other embodiments, position information comprises three dimensional Cartesian coordinate (x,y,z) locations of features. In some embodiments, position information comprises two dimensional polar coordinate (r, θ) locations for features. In other embodiments, position information comprises three dimensional spherical coordinate (r, θ, φ) locations for features. In some embodiments, the calibrated list comprises size information of features. Size information refers to physical or equivalent dimensions of features. In some embodiments, size information of a feature comprises the width of the feature along three Cartesian coordinate axes. In some embodiments, size information of a feature comprises the width of the feature along two Cartesian coordinate axes. In some embodiments, size information of the feature comprises the volume of the feature. In some embodiments, size information of the feature comprises the area spanned by the feature on the surface. Equivalent size information may also be used in calibrated list. In some embodiments, equivalent size information refers to the diameter of a PSL or a silica sphere having the same volume as the feature. That is, equivalent size may be computed as $$2(3V_f/4\pi)^{1/3},$$

where $V_f$ is the volume of the feature. In some embodiments, equivalent size information refers to the diameter of a PSL or a silica sphere having half the surface area as the area spanned by feature on the calibrated surface. That is, equivalent size may be computed as $$2(A_f/\pi)^{1/2},$$

where $A_f$ is the area spanned by the feature on the surface. In some embodiments, the calibrated list comprises feature type information. Feature type information refers to a category assigned to a feature based on its shape and size. Feature types include defects such as particles, crystal originated particles, process induced defects, residues, and scratches. In some embodiments, feature type information may also include qualitative information on size of a feature, such as large or small. For example, particles may be further categorized into large particles and small particles. Similarly, process induced defects may be categorized into small process induced defects and large process induced defects.

The calibrated list represents ground truth information about the features located on surface. In some embodiments, position, size, and type information of features present in calibrated list are obtained from high resolution images of features on the calibrated surface. In some embodiments, adaptive resolution images of the calibrated surface may be used for obtaining feature information in calibrated list. In some embodiments, calibrated list is obtained by capturing an image of calibrated surface, having one or more feature pixels for each feature; and estimating position, size, and type of each feature from the feature pixels. For example, images from an electron microscope capture feature images with high resolution. Atomic force microscope and near field optical microscope may also be used to capture feature images with high resolution. The imaging system used for high resolution imaging depends on the size of features. If the size of features are in the nanometer scale, systems with nanometer scale resolution such as an electron microscope, near field optical microscope, or an atomic force microscope is used. Alternatively, if the size of feature is in the micron scale, systems with micrometer scale resolution such as an optical microscope may be used for capturing high resolution images. On the other hand, if the size of feature are macroscopic, systems with macroscopic scale resolution such as cameras and telescopes may be used for capturing high resolution images. Each feature is sampled by at least a predetermined number of pixels that are sufficient to estimate the position, size, and type of features with high accuracy.

In some embodiments, multiple two dimensional images of a feature are captured to generate a three dimensional image of the feature. For instance, two or more images with different illumination angles are captured, and photometric stereo algorithm may be used to reconstruct a three dimensional image of feature. Alternatively, a three dimensional image of feature may be generated from two dimensional images captured from two or more viewpoints.

The two dimensional position of a feature may be calculated as the centroid of the area spanned by the feature on the calibrated surface. Similarly, the three dimensional position of a feature may be calculated as the centroid of the volume spanned by the feature. The position of a feature may also be calculated as a point on the feature or inside the volume of the feature. In some embodiments, position of a feature is calculated as the point having the highest intensity value in the high resolution image of feature. In other embodiments, position of a feature is calculated as the position of a corner of the feature. In some embodiments, position of a feature is calculated by fitting the high resolution image of feature with a computational model of the feature; shifting the model spatially with respect to the high resolution image of feature; computing an error metric, such as difference, between the model and the high resolution image at each shift; and declaring the position of feature as the position of shift having the least error metric. In some embodiments, the position information is computed in Cartesian coordinates. In other embodiments, the position information is computed in polar coordinates. In some embodiments, the position information is computed in spherical coordinates. In some embodiments, the origin of the coordinate system is the center of the calibrated surface.

The size of feature may be calculated by measuring the width of pixels in high resolution image that comprises the feature. A two dimensional width is calculated by measuring the width of pixels along two Cartesian coordinate axes. Similarly, a three dimensional width is calculated by measuring the width of pixels along three Cartesian coordinate axes. The width of feature thus calculated is transformed into a physical width by multiplying with pixel width. That is, $W_f=N_w W_p$, where $W_f$ is width of feature, $N_w$, is number of feature pixels along a coordinate axis, and $W_p$ is the width of a pixel. Width of a pixel refers to the physical width spanned by the pixel on the calibrated surface. Area of a feature is computed by counting the number of pixels spanned by the feature in a two dimensional image and multiplying the pixel count with pixel area. That is, $A_f=N_A A_p$, where $A_f$ is area of feature, $N_A$ is number of feature pixels within feature in the high resolution image, and $A_p$ is the area of a pixel. Area of a pixel refers to the physical area spanned by the pixel on the calibrated surface. Similarly, volume of a feature is computed by counting the number of voxels spanned by the feature in a three dimensional image and multiplying the voxel count with voxel volume. That is, $V_f=N_v V_v$, where $V_f$ is volume of feature, $N_v$ is number of feature voxels within feature in the three dimensional high resolution image, and $V_v$ is the volume of a voxel. Volume of a voxel refers to the physical volume spanned by the voxel in the calibrated surface.

The type of a feature is determined from the shape of the feature in the high resolution image. In some embodiments, feature pixels in the high resolution image are compared with models of various feature types to determine a close match. The feature type corresponding to the model having the closest match to the feature pixels is declared as the feature type of the feature pixels. In some embodiments, scaled, rotated, and translated models of different types of features may be compared with the feature pixels to determine the model that closely matches the feature pixels.

In some embodiments, well defined features are deposited on a calibrated surface at predetermined locations. In such embodiments, feature properties of the calibrated surface are known. Accordingly, a calibrated list is generated from the position of deposition of a feature, the size of the deposited feature, and the type of the deposited feature.

The calibrated list also comprises calibrated characteristic parameters. The calibrated characteristic parameter quantifies and groups features in a calibrated list that have a unifying characteristic. Unifying characteristic refers to a property that is common to different features. For example, a subset of features in the calibrated list may have a similar feature type. In this case, feature type is the unifying characteristic between the subset of features. In another example, a subset of features in the calibrated list may have a similar size. In this case, size is the unifying characteristic between the subset of features. In yet another example, a subset of features in the calibrated list may have similar position information. In this case, spatial region is the unifying characteristic between the subset of features. Similar position refers to position of features that are located in the same region of surface. In some embodiments, calibrated characteristic parameter is the total number of features in said calibrated list having a unifying characteristic. In some embodiments, calibrated characteristic parameter is proportional to the total number of features in said calibrated list having a unifying characteristic. In some embodiments, calibrated characteristic parameter is a function of the total number of features in said calibrated list having a unifying characteristic. Multiple calibrated characteristic parameters may be computed for multiple unifying characteristics. For instance, three different calibrated characteristic parameters may be computed for features with similar type, features with similar size, and features with similar positions, respectively. In some embodiments, a calibrated characteristic parameter may be computed so that it quantifies features in calibrated list that have two or more unifying characteristics. For instance, a calibrated characteristic parameter may be computed for features in matched list that have a given type and a given size range. Alternatively, a calibrated characteristic parameter may be computed for features in calibrated list that have a given size range and a given position range.

In block 19, the calibrated surface is inspected with an inspection system that needs to be certified. The inspection system inspects for features on the calibrated surface. After inspection, the inspection system generates an estimated list. The estimated list comprises information about the features on the calibrated surface. For example, the estimated list comprises position information of features on calibrated surface that are detected by the inspection system. In some embodiments, position information comprises two dimensional Cartesian coordinate locations (x,y) for features. In some embodiments, position information comprises three dimensional Cartesian coordinate (x,y,z) locations for features. In some embodiments, position information comprises two dimensional polar coordinate (r, θ) locations for features. In some embodiments, position information comprises three dimensional spherical coordinate (r, θ, φ) locations for features. In some embodiments, the estimated list comprises size information of features. In some embodiments, size information of a feature comprises the width of the feature along three Cartesian coordinate axes. In other embodiments, size information of a feature comprises the width of the feature along two Cartesian coordinate axes. In some embodiments, size information of the feature comprises the volume of the feature. In some embodiments, size information of the feature comprises the area spanned by the feature on the surface. Equivalent size information may also be used in the estimated list. In some embodiments, equivalent size information refers to the diameter of a PSL or a silica sphere having the same volume as the feature. In some embodiments, equivalent size information refers to the diameter of a PSL or a silica sphere having half the surface area as the area spanned by feature on the surface. In some embodiments, the estimated list comprises feature type information. Feature type information refers to a category assigned to a defect based on its shape and size. Feature types include defects such as particles, crystal originated particles, process induced defects, residues, and scratches. In some embodiments, feature type information may also include qualitative information on size such as large or small. For example, particles may be further categorized into large particles and small particles. Similarly, process induced defects may be categorized into small process induced defects and large process induced defects.

Unlike calibrated list, the estimated list may not represent ground truth information about the features on calibrated surface. Instead, estimated list represents an estimate of feature information as determined by the inspection system that needs to be certified.

In block 20, a matched list is generated by searching for the presence of calibrated features in the estimated list. Calibrated features are features present in the calibrated list. Searching for a calibrated feature in estimated list involves determining if a feature in estimated list has a substantially similar position information as the position information of the calibrated feature. In some embodiments, searching for a calibrated feature in estimated list involves determining if a feature in estimated list has a substantially similar position and size information as the position and size information, respectively, of the calibrated feature. In some embodiments, searching for a calibrated feature in estimated list involves determining if a feature in estimated list has a substantially similar position, size, and type information as the position, size, and type information, respectively, of the calibrated feature. The matched list comprises a list of calibrated features that are present in the estimated list. In other words, the matched list comprises features that are common to both calibrated list and estimated list. Features in matched list are referred to as matched features.

In some embodiments, the estimated list may have less information about a feature than the calibrated list. For example, a calibrated list may comprise position, size, and type information for each feature, whereas the estimated list may comprise position and size information for each feature. In such cases, searching for a calibrated feature in estimated list involves searching for features with substantially similar position information as the calibrated feature; or searching for features with substantially similar position and size information as the calibrated feature. Nevertheless, matched list may also comprise type information of a feature even though the estimated list did not have type information. The type information may be acquired from the matched feature in calibrated list. The number of features in matched list is less than or equal to the number of features in calibrated list. However, for each matched feature, the matched list comprises all feature information as the calibrated list. In the example considered above, the matched list comprises information on position, size, and type even though the estimated list does not comprise type information.

In block 21, an estimated characteristic parameter is computed from the matched list. The estimated characteristic parameter quantifies or groups features in a matched list that have a unifying characteristic. Unifying characteristic refers to a property that is common to different features. For example, a subset of features in the matched list may have a similar feature type. In this case, feature type is the unifying characteristic between the subset of features. In another example, a subset of features in the matched list may have a similar size. In this case, size is the unifying characteristic between the subset of features. In yet another example, a subset of features in the matched list may have similar position information. In this case, spatial region is the unifying characteristic between the subset of features. Similar position refers to position of features that are located in the same region of surface. In some embodiments, estimated characteristic parameter is the total number of features in the matched list having a unifying characteristic. In some embodiments, estimated characteristic parameter is proportional to the total number of features in the matched list having a unifying characteristic. In some embodiments, estimated characteristic parameter is a function of the total number of features in the matched list having a unifying characteristic. Multiple estimated characteristic parameters may be computed for multiple unifying characteristics. For instance, three different estimated characteristic parameters may be computed for features with similar type, features with similar size, and features with similar positions, respectively.

In some embodiments, an estimated characteristic parameter may be computed so that it quantifies features in matched list that have two or more unifying characteristics. For instance, an estimated characteristic parameter may be computed for features in matched list that have a given type and a given size range. Alternatively, the estimated characteristic parameter may be computed for features in matched list that have a given size range and a given position range.

In block 22, one or more estimated characteristic parameters computed from the matched list is compared with their corresponding calibrated characteristic parameters. An estimated characteristic parameter corresponds to a calibrated characteristic parameter that has a similar unifying characteristic as the estimated characteristic parameter. In some embodiments, comparison of estimated characteristic parameter with calibrated characteristic parameter is done by computing capture probability. Capture probability refers to the ratio of estimated characteristic parameter to calibrated characteristic parameter. Capture probabilities may be computed for multiple unifying characteristics, by computing ratios of estimated characteristic parameters with multiple unifying characteristics to corresponding calibrated characteristic parameters with multiple unifying characteristics. For example, capture probability for a given type may be computed by computing the ratio of estimated characteristic parameter for the given type to calibrated characteristic parameter for the given type. Similarly, capture probability for a given size may be computed by computing the ratio of estimated characteristic parameter for the given size to calibrated characteristic parameter for the given size. Further, capture probability for a given position may be computed by computing the ratio of estimated characteristic parameter for the given position to calibrated characteristic parameter for the given position. Also, capture probability for a given type and size may be computed by computing the ratio of estimated characteristic parameter for the given type and size to calibrated characteristic parameter for the given type and size.

To certify an inspection system, thresholds for capture probabilities may be established for various unifying characteristics. In some embodiments, an inspection system is certified for inspecting a unifying characteristic if its capture probability for the unifying characteristic is greater than or equal to the capture probability threshold for the unifying characteristic. Further, an inspection system is considered to be certified for one or more unifying characteristics if the capture probability of the inspection system for each unifying characteristic is greater than or equal to the capture probability threshold for the respective unifying characteristic. Accordingly, the ability of an inspection system to detect features with one or more characteristics is certified.

The value of capture probability threshold may be adapted according to the importance of a unifying characteristic. For example, if the detection of a first feature type is more important (to maximize yield) than the detection of a second feature type, then the capture probability threshold for the first feature type is designed to be higher than the capture probability for the second feature type. Similarly, if the detection of a first feature size is more important (to maximize yield) than the detection of a second feature size, then the capture probability threshold for the first feature size is designed to be higher than the capture probability for the second feature size. Furthermore, if the detection of a first feature position range is less important (to maximize yield) than the second feature position range, then the capture probability threshold for the first feature position range is designed to be lower than the capture probability for the second feature position range.

Figure 2:
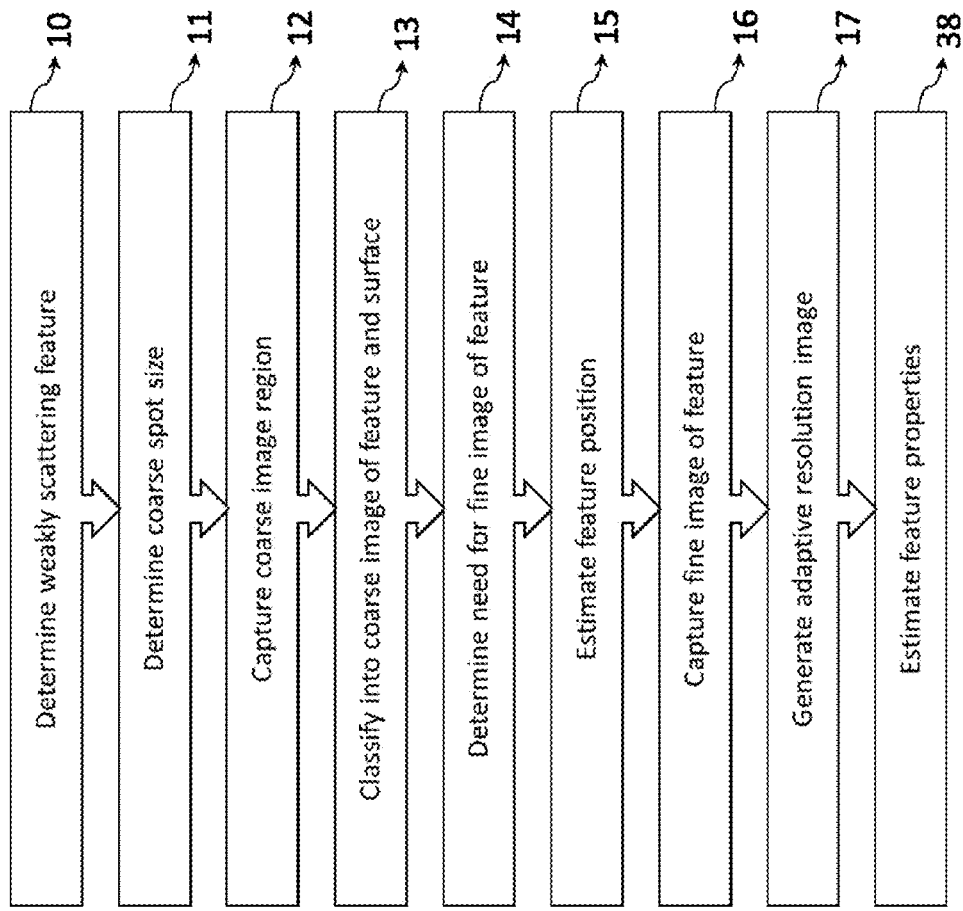
FIG. 2 illustrates an exemplary flow chart for generating an adaptive resolution image and estimating feature properties, in accordance with the invention.

FIG. 2 illustrates an exemplary flow chart for generating an adaptive resolution image and estimating feature properties, in accordance with the invention. An adaptive resolution image of a surface has a fine resolution in regions of surface having features and a coarse resolution in featureless surface regions. In other words, the resolution in adaptive resolution image is adapted to the spatial frequency of different regions of surface. In surface regions with high spatial frequencies, the adaptive resolution image exhibits a fine resolution. Alternatively, in surface regions with low spatial frequencies, the adaptive resolution image exhibits a coarse resolution. In block 10, a weakly scattering feature that needs to be resolved in the adaptive resolution image is determined. In some embodiments, a feature is considered to be resolved in an image if at least a predetermined number of pixels sample the feature. In some embodiments, the weakly scattering feature is the smallest feature size that needs to be resolved on the surface. The intensity of light scattering reduces as the size of the feature is reduced. Accordingly, scattering from a smaller feature size is weaker than scattering from a larger feature size, when both the smaller and larger features have similar material properties. Scattering intensity is also dependent on material properties. For example, a feature with a higher refractive index difference with respect to its surrounding medium scatters more than an equivalently sized feature with a lower refractive index difference with respect to its surrounding medium. In some embodiments, a weakly scattering feature is the feature having the lowest refractive index difference, with respect to its surrounding medium, that needs to be resolved on the surface. In block 11, a coarse spot size is determined such that the weakly scattering feature is detected in an image captured with the coarse spot size. Spot size refers to the size of the smallest resolvable feature in an image. An image comprises of a plurality of pixels. Each pixel carried a value that represents the intensity of image response at the location of the pixel. In some embodiments, an image is captured from a two dimensional image sensor comprising a plurality of pixels. In other embodiments, an image is captured by scanning a spot on a plurality of locations on a surface; detecting image responses at each location; and stitching image responses from a plurality of locations of the surface. Detection of a feature is different from resolving a feature. An image may detect a feature without resolving it. A feature is considered to be detected even if the feature is not sampled by a predetermined number of pixels that are required for resolving the feature. Nevertheless, a feature is considered to be detected in an image only if one or more pixels in the image region corresponding to the feature has a substantially different value than other pixels in the neighborhood. In some embodiments, the number of pixels required for detecting a feature is substantially less than the number of pixels required for resolving the feature. As the spot size is increased, the number of pixels sampling a feature decreases. Accordingly, the smallest resolvable feature in an image captured with a larger spot size is larger than the smallest resolvable feature in an image captured with a smaller spot size. As the spot size is increased beyond the minimum spot size required for resolving a feature, the feature spans fewer number of pixels than the minimum number of pixels required to resolve the feature. Accordingly, the feature is not resolved. Nevertheless, if the pixel values in the feature region of an image are substantially different from other pixel values in the neighborhood, the feature is considered as detected. As spot size increases, the image response of a feature also becomes weak. In some embodiments, the largest spot size with which the weakly scattering feature is detected is determined as the coarse spot size. As the spot size is increased beyond the coarse spot size, the weakly scattering feature may not be detected reliably.

In block 12, an image of a predetermined region of a surface, called coarse image of region, is captured with the coarse spot size. In some embodiments, the magnification of the imaging module used to capture the coarse image of region is adjusted such that the spot size of the image is equal to the coarse spot size. In some embodiments, a beam is scanned on the surface to capture the coarse image of region. In this case, the spot size of the beam is adjusted to have a value similar to the coarse spot size. In some embodiments, a wide field imaging module is used to capture the coarse image of region. In this case, the magnification of the image is adjusted such that the pixel size of the image is similar to the coarse spot size. Pixel size of the image refers to the physical size a pixel spans on the surface. A coarse image of region comprises one or more pixels corresponding to a predetermined region of the surface.

In block 13, the coarse image of region is classified into a coarse image of feature or a coarse image of surface. The pixels in the coarse image of region having a feature are considered as coarse image of feature, and the pixels in the coarse image of region not having a feature are considered as coarse image of surface. In some embodiments, classifying coarse image of region into a coarse image of feature and a coarse image of surface comprises searching for an edge pixel, in coarse image of region, having a substantially different value than other pixels in the neighborhood; declaring a coarse image of region with one or more edge pixels as a coarse image of feature; and declaring a coarse image of region with no edge pixels as a coarse image of surface.

In block 14, a coarse image of feature is processed to determine the need for a fine image of feature. In some embodiments, the number of pixels spanned by the edge pixels of feature is counted. In some embodiments, a fine image of feature is determined to be needed if the number of pixels spanned by the edge pixels of feature is less than a predetermined number of pixels required to resolve the feature, and if the spot size used for acquiring the coarse image of region is greater than a predetermined minimum spot size. Blocks 15 and 16 are applicable if a fine image of feature is determined to be needed. In block 15, the position of feature is determined. In some embodiments, the position of feature is estimated as the midpoint of a contour formed by the edge pixels. In some embodiments, the centroid of the edge pixels is considered as the position of the feature. In other embodiments, the position of feature is estimated as the centroid of the feature pixels of coarse image of region. In block 16, a fine image of feature is captured. A fine image of feature is captured with a fine spot size, having a spot size smaller than the coarse spot size. Accordingly, a pixel in fine image of feature spans a smaller region of surface than a pixel in coarse image of region. The field of view of fine image of feature is centered on the feature position estimated in block 15.

In some embodiments, the fine image of feature is further considered as the coarse image of region obtained from block 12, and the operations of block 13 and block 14 are performed on the fine image of feature obtained from block 16. Accordingly, the steps of classifying into image of feature and image of surface, and determining the need for another fine image of feature are repeated, although this time on the fine image of feature. If it is determined to acquire another fine image of feature, feature position is estimated and another fine image of feature is captured with a spot size that is smaller than the spot size of the previously captured fine image of feature. In some embodiments, the considering of fine image of feature as coarse image of region is continued until a predetermined sampling criterion is met, or until spot size is less than or equal to a predetermined minimum spot size. In some embodiments, the predetermined minimum spot size is the minimum spot size allowed by the imaging module used to capture the images of surface. In some embodiments, the predetermined sampling criterion refers to a feature being sampled by a predetermined number of pixels for the feature to be resolved.

In some embodiments, multiple two dimensional (2D) images of feature are captured to generate a three dimensional (3D) image of the feature. For instance, the illumination angle is varied in two dimensional images and photometric stereo algorithm may be used to reconstruct a three dimensional image of feature. Alternatively, a three dimensional image of feature may be generated from two dimensional images captured with two or more view angles. In some embodiments, multiple 2D images are captured for 3D reconstruction after it is determined that no more fine images of feature are needed in block 14. Accordingly, multiple 2D images are captured with a spot size that is known to generate a high resolution image that resolves a feature.

After a coarse image of region and sufficient number of fine images of feature are captured, it may be determined in block 14 that there is no further need for capturing any finer images. In such a scenario, all captured images are combined to generate an adaptive resolution image in block 17. An adaptive resolution image exhibits high spatial resolution in surface regions having features and a low spatial resolution surface regions without features. Accordingly, the adaptive resolution image exhibits non-uniform sampling. The adaptive resolution image comprises a coarse image of region for all regions of the surface, and one or more fine images of feature for regions of surface having features. In some embodiments, an adaptive resolution image is computed by interpolating coarse image of surface to generate an interpolated image of surface; and stitching the interpolated image of surface with a fine image of feature.

In block 38, feature properties are estimated from fine images of feature. Feature properties include position, size, and type of a defect. The two dimensional position of a feature may be calculated as the centroid of the area spanned by the feature on the surface. Alternatively, the three dimensional position of a feature may be calculated as the centroid of the volume spanned by the feature. The position of a feature may also be calculated as any other point on the feature or inside the volume of the feature. In some embodiments, position of a feature is calculated as the point having the highest intensity value in an image of feature. In other embodiments, position of a feature is calculated as the position of a corner of the feature. In some embodiments, position of a feature is calculated by fitting an image of feature with a computational model of the feature; shifting the model spatially with respect to the image of feature; computing an error metric, such as difference, between the model and the image of feature at each shift; and declaring the position of feature as the position of shift having the least error metric. In some embodiments, the position information is computed in Cartesian coordinates. In other embodiments, the position information is computed in polar coordinates. In some embodiments, the position information is computed in spherical coordinates. In some embodiments, the origin of the coordinate system is the center of the calibrated surface.

The size of feature may be calculated by measuring the width of pixels in an image that comprises the feature. A two dimensional width is calculated by measuring the width of pixels along two Cartesian coordinate axes. Alternatively, a three dimensional width is calculated by measuring the width of pixels along three Cartesian coordinate axes. The width of feature thus calculated is transformed into a physical width by multiplying with pixel width. That is, $W_f = N_w w_p$, where $W_f$ is width of feature, $N_w$ is number of feature pixels along a coordinate axis, and $W_p$ is the width of a pixel. Width of a pixel refers to the physical width spanned by the pixel on the surface. Area of a feature is computed by counting the number of pixels spanned by the feature in a two dimensional image and multiplying the pixel count with pixel area. That is, $A_f = N_A A_p$, where $A_f$ is area of feature, $N_A$ is number of feature pixels within feature in the high resolution image of feature, and $A_p$ is the area of a pixel. Area of a pixel refers to the physical area spanned by the pixel on the surface. Similarly, volume of a feature is computed by counting the number of voxels spanned by the feature in a three dimensional image and multiplying the voxel count with voxel volume. That is, $V_f = N_v V_v$, where $V_f$ is volume of feature, $N_v$ is number of feature voxels within feature in a three dimensional high resolution image of feature, and $V_v$ is the volume of a voxel. Volume of a voxel refers to the physical volume spanned by the voxel in the surface.

The type of a feature is determined from the shape of the feature in an image of feature. In some embodiments, feature pixels in an image of feature are compared with models of various feature types to determine a close match. The feature type corresponding to the model having the closest match to feature pixels is declared as the feature type of feature pixels. In some embodiments, scaled, rotated, and translated models of difference types of feature may be compared with the feature pixels to determine to the model that closely matches the feature pixels.

In some embodiments, feature properties, such as position, size, and type, may be used to generate a calibrated list required for certifying an inspection system. In this case, the surface that was used to obtain the feature properties and calibrated list is considered as the calibrated surface. In other embodiments, feature properties, such as position, size, and type, may be used to study features (including defects) present on the surface. In some embodiments, this information may be used to determine the root cause of defects present on the surface.

Figure 3:
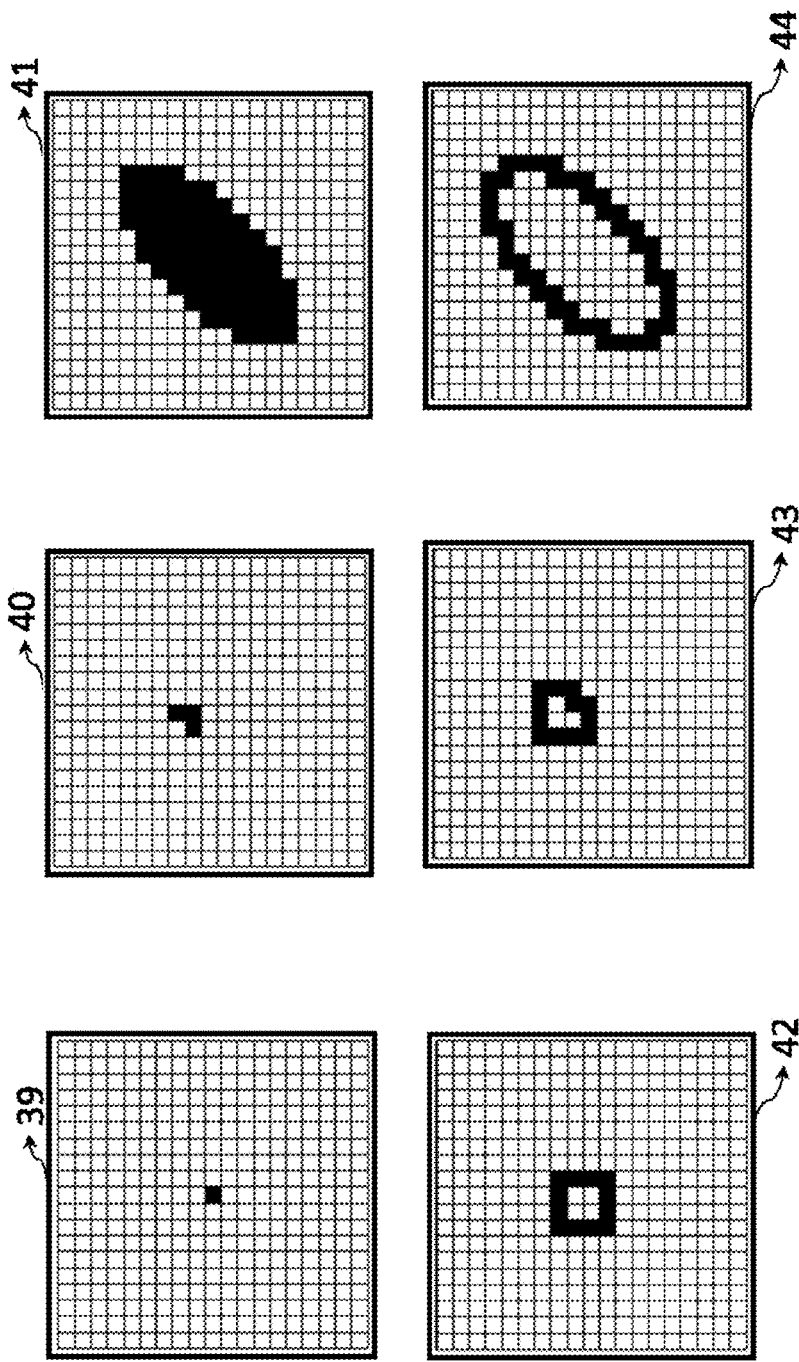
FIG. 3 illustrates coarse and fine images of feature and their corresponding edge pixels, in accordance with the invention.

FIG. 3 illustrates coarse and fine images of a feature and their corresponding edge pixels, in accordance with the invention. The feature is located on a surface to be imaged. A coarse image of region 39 comprises a feature pixel which has substantially different pixel value than other pixels in the neighborhood. Accordingly, an edge image 42 corresponding to coarse image of region 39 comprises edge pixels. A variety of edge detection methods may be used for computing edge pixels. Examples of edge detection methods include Canny, Sobel, Roberts, Prewitts, and Laplacian of Gaussian methods. The edge image 42 is used to count the number of pixels spanned by the edge. In some embodiments, the number of pixels spanned by the edge refers to pixels inside the edge contour. In other embodiments, the number of pixels spanned by the edge included both pixels inside the edge contour and pixels on the edge contour. If the number of pixels spanned by the edge contour is less than a predetermined threshold, and if the spot size used for capturing coarse image 39 is greater than the minimum spot size, a fine image of feature is captured. In some embodiments, the position of feature is estimated as the midpoint of a contour formed by the edge pixels in edge image 42. In some embodiments, the centroid of the edge pixels in edge image 42 is considered as the position of the feature. In other embodiments, the position of feature is estimated as the centroid of the feature pixels of coarse image 39. A fine image of feature 40, having a smaller spot size than the coarse spot size, is captured at the estimated feature position. Accordingly, a pixel of fine image 40 spans a smaller area on the surface than a pixel of coarse image 39. Consequently, a feature appears larger in fine image 40 than in coarse image 39. That is, the number of pixels sampling the feature is larger in fine image 40 than in coarse image 39. An edge image 43 of fine image 40 is computed. The number of pixels spanned by edge contour is counted. Since the number of pixels spanned by edge contour is still less than the predetermined number of pixels required for resolving the feature, and since the fine spot size is greater than the minimum spot size, another fine image of feature 41 is captured. The spot size of fine image 41 is smaller than the spot size of fine image 40. Accordingly, a pixel of fine image 41 spans a smaller area on the surface than a pixel of fine image 40. Consequently, a feature appears larger in fine image 41 than in fine image 40. That is, the number of pixels sampling the feature is larger in fine image 41 than in fine image 40. An edge image 44 of fine image 41 is computed. The number of pixels spanned by edge contour is counted. The number of pixels spanned by edge contour is found to be greater than the predetermined number of pixels required to resolve the feature. The feature is considered to be resolved in fine image 41.

In some embodiments, a feature may be large and may be resolved in coarse image of region. In this scenario, a fine image of feature having a smaller spot size than coarse image of region is not captured. In some embodiments, a coarse image of region may not comprise a feature. In this case, edge pixels are not available within the coarse image of region. Therefore, a fine image of feature having a smaller spot size than coarse image is not captured.

In some embodiments, a surface may be repositioned relative to an imaging module used for capturing an image to capture a wide field of view. In some embodiments, the imaging module is an electron microscope. In other embodiments, the imaging module is an optical microscope. In some embodiments, the imaging module comprises a two dimensional image sensor having a plurality of photodetectors, called pixels. The imaging module has two or more spot sizes to captures images with coarse and fine resolutions. By repositioning the surface with respect to the imaging module, an adaptive resolution image may be generated at multiple positions of the surface. The adaptive resolution images generated at multiple positions are then stitched to generate a wide field adaptive resolution image. In some embodiments, a Cartesian scanning procedure is used to reposition the surface with respect to the imaging module. In some embodiments, the surface is placed on a chuck to secure the surface in place. The chuck is then translated in horizontal and vertical directions along the plane of the surface. In some embodiments, a spiral scanning procedure is used to reposition the surface with respect to the imaging module. In some embodiments, the surface is placed on a chuck to secure the surface in place. The chuck is then simultaneously rotated and translated.

Figure 4:
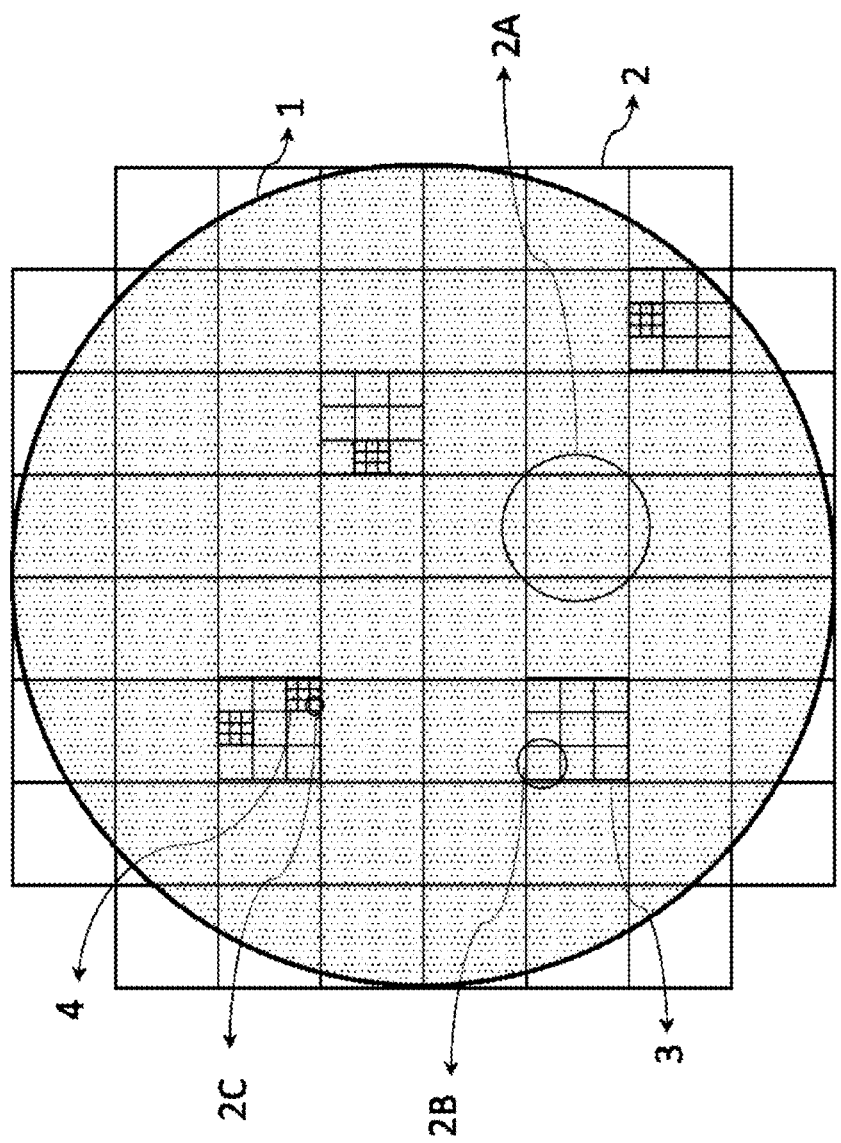
FIG. 4 shows a Cartesian scanning procedure for acquiring an adaptive resolution image with a wide field of view, in accordance with the invention.

FIG. 4 shows a Cartesian scanning procedure for acquiring an adaptive resolution image with a wide field of view, in accordance with the invention. A surface 1 is scanned by a coarse spot 2A to form a coarse image of region 2. The coarse image of region 2 is searched for feature pixels with substantially different pixel values than other pixels in the neighborhood. In feature regions that are not resolved by coarse image of region 2, a fine spot 2B is scanned to capture a fine image of feature 3. The size of fine spot 2B is smaller than the size of coarse spot 2A. The fine image of feature 3 is searched for feature pixels with substantially different pixel values than other pixels in the neighborhood. In feature regions that are not resolved by fine image of feature 3, a fine spot 2C is scanned to capture another fine image of feature 4. The size of fine spot 2C is smaller than the size of coarse spot 2B. Accordingly, FIG. 4 shows three resolution levels. The third level image region 4 has finer resolution than the second level image region 3, which has finer resolution than the first level image region 2. In some embodiments, the first level image region 2 spans a substantial area of surface 1. In some embodiments, the first level image region 2 spans the entire area of surface 1. However, the second level image region 3 spans selected areas of surface where a feature is detected by the first level image region 2. Similarly, the third level image region 4 spans selected areas of surface where a feature is detected by the second level image region 3. In some embodiments, all pixels at a given resolution level are captured before proceeding to capture pixels at a finer resolution level. In such embodiments, for example, all pixels of first level image region 2 are captured before pixels of second level image region 3 are captured. In other embodiments, finer resolution pixels are captured immediately after a feature is detected in a coarse level image pixel. In such embodiments, for example, pixels of second level image region 3 are captured before all pixels of first level image region 2 are captured. Such embodiments may enable high speed scanning because of the proximity of the position of second level image region 3 to the current position of coarse spot 2A. In other words, since the coarse spot is already close to the location where a fine image needs to be captured, there is no necessity to shift the surface relative to the spot through a large distance in order to capture a fine image of feature.

The image response corresponding to a spot is called as a pixel. A pixel at a resolution level may be scanned in a unidirectional or bidirectional raster scan. Unidirectional scan refers to a scanning strategy where pixels are captured from left to right or from right to left. Consider a pixel A. In a left to right unidirectional scan, pixel A is scanned before the pixel to the right of pixel A (in the same row) is scanned. When all pixels in a row are scanned, scanning moves on to the left most column of the next row. In a right to left unidirectional scan, pixel A is scanned after a pixel to the right of pixel A (in the same row) is scanned. When all pixels in a row are scanned, scanning moves on to the right most column of the next row. In a bidirectional scan, left to right scanning and right to left scanning are adopted in successive rows. For example, the pixels of the first row are scanned from left to right, and pixels of the second row are scanned from right to left. Alternatively, the pixels of the first row are scanned from right to left, and pixels of the second row are scanned from left to right. Consider pixel B in a row M and pixel B in a row M+1 of a bidirectional scan. Pixel B is scanned before the pixel to the right of pixel B (in the same row) is scanned, and pixel C is scanned after a pixel to the right of pixel C (in the same row) is scanned. In some embodiments, fine images 3 and 4 are captured with unidirectional raster, bidirectional raster, spiral, or circular scanning of spots 2B and 2C, respectively.

Figure 5:
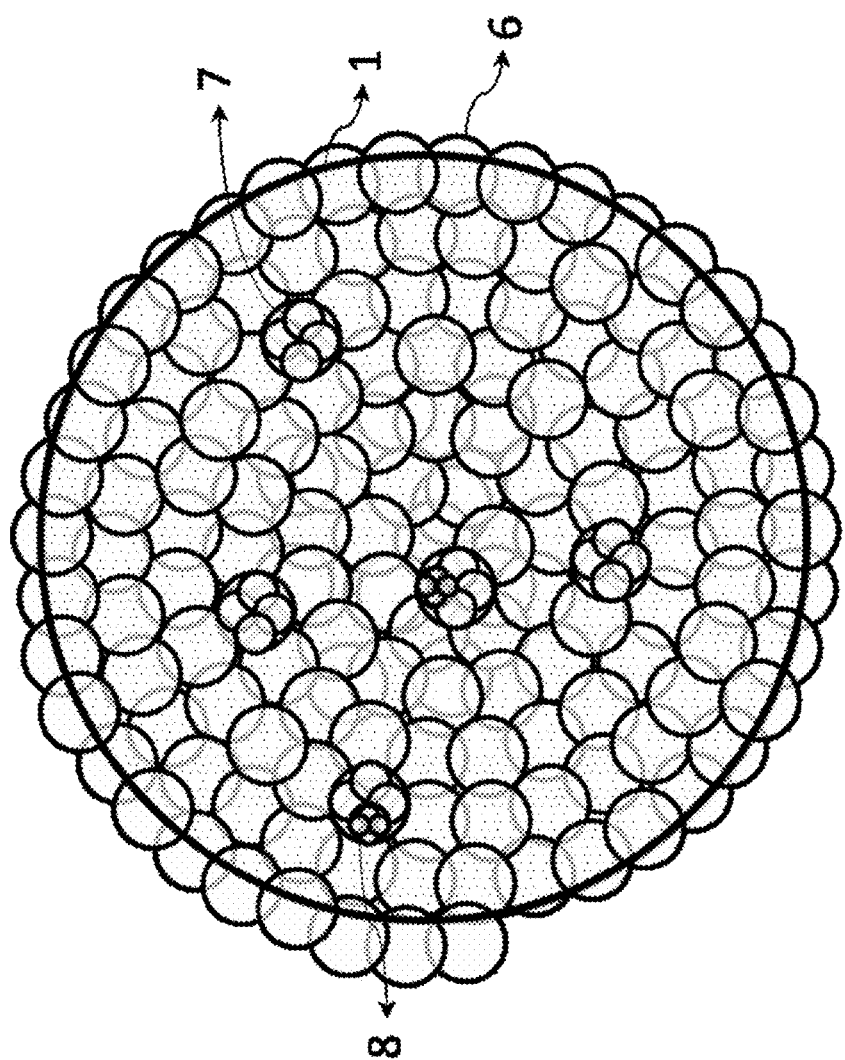
FIG. 5 shows a spiral scanning procedure for acquiring an adaptive resolution image with a wide field of view, in accordance with the invention.

FIG. 5 shows a spiral scanning procedure for acquiring an adaptive resolution image with a wide field of view, in accordance with the invention. A surface 1 is scanned by a coarse spot 6 to form a coarse image of region. The coarse image of region is searched for feature pixels with substantially different pixel values than other pixels in the neighborhood. In feature regions that are not resolved by coarse image of region, a fine spot 7 is scanned to capture a fine image of feature. The size of fine spot 7 is smaller than the size of coarse spot 6. The fine image of feature is searched for feature pixels with substantially different pixel values than other pixels in the neighborhood. In feature regions that are not resolved by fine image of feature, a fine spot 8 is scanned to capture another fine image of feature. The size of fine spot 8 is smaller than the size of fine spot 7. Accordingly, FIG. 5 shows three resolution levels. The third level image region captured with spot 8 has finer resolution than the second level image region captured with spot 7, which has finer resolution than the first level image region captured with spot 6. In some embodiments, the first level image region captured with spot 6 spans a substantial area of surface 1. In some embodiments, the first level image region captured with spot 6 spans the entire area of surface 1. However, the second level image region captured with spot 7 spans selected areas of surface where a feature is detected by the first level image region captured with spot 6. Similarly, the third level image region captured with spot 8 spans selected areas of surface where a feature is detected by the second level image region captured with spot 7. In some embodiments, all pixels at a given resolution level captured before proceeding to capture pixels at a finer resolution level. In such embodiments, for example, all pixels of first level image region captured with spot 6 are captured before pixels of second level image region captured with spot 7 are captured. In other embodiments, finer resolution pixels are captured immediately after a feature is detected in a coarse level image pixel. In such embodiments, for example, pixels of second level image region captured with spot 7 are captured before all pixels of first level image region are captured with spot 6. Such embodiments may enable high speed scanning because of the proximity of the position of second level image region to the current position of coarse spot 6. In other words, since the coarse spot is already close to the location where a fine image needs to be captured, there is no necessity to shift the surface relative to the spot through a large distance in order to capture a fine image of feature.

The pixels in the image captured by spot 6 are formed by scanning spot 6 along a spiral trajectory. A spiral trajectory allows for high speed scanning when compared to unidirectional raster scan. In some embodiments, spot 6 starts at the center of surface 1 and scans other regions of the surface along a spiral trajectory until a desired area of interest is scanned. Alternatively, spot 6 may be scanned from the outer edge of surface 1 along a spiral trajectory towards the center of surface 1. In some embodiments, a spiral trajectory is followed for scanning finer spots 7 and 8. In other embodiments, a circular scanning trajectory is followed for scanning finer spots 7 and 8. In some embodiments, a unidirectional or a bidirectional raster scan trajectory is followed for scanning finer spots 7 and 8.

Figure 6:
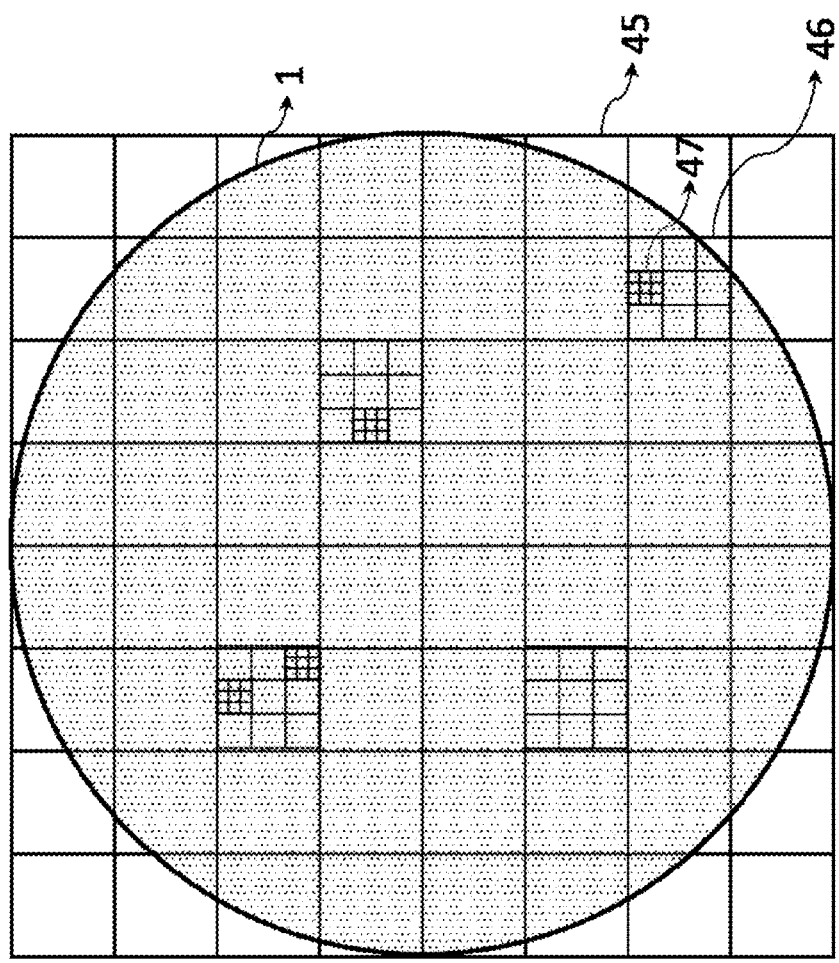
FIG. 6 shows a method for acquiring an adaptive resolution image with a wide field of view by using an imaging module with variable magnification and a two dimensional image sensor, in accordance with the invention.

FIG. 6 shows a method for acquiring an adaptive resolution image with a wide field of view by using an imaging module with variable magnification and a two dimensional image sensor, in accordance with the invention. An imaging module comprising a two dimensional image sensor is used to capture a coarse image of region and sufficient number of fine images feature. The image sensor has a plurality of photodetectors called pixels. A coarse image of region 45 is captured to span a substantial area of surface 1. In some embodiments, the coarse image of region 45 spans the entire area of surface 1. Accordingly, the coarse image of region has a wide field of view. The coarse image of region 45 is captured by tuning the magnification (zoom) of an imaging module such that an image of a substantial region of surface 1 is formed on a two dimensional image sensor. The coarse image of region 45 is searched for feature pixels having a substantially different pixel value than other pixels in the neighborhood. If the pixels captured by coarse image of region 45 is not sufficient to resolve a feature detected by coarse image of region 45, a fine image of feature 46 is captured. The magnification of fine image of feature 46 is larger than coarse image of region 45. Spot size of an image is the smallest resolvable feature of an image. Accordingly, the spot size of fine image of feature 46 is smaller than the spot size of coarse image of region 45. The fine image of feature 46 is captured by increasing the magnification or zoom of the imaging module. Also, the fine image of feature 46 is captured only for regions comprising a defect in coarse image of region 45. Further, the fine image of feature 46 is centered on a feature position computed from coarse image of region 45. The fine image of feature 46 is searched for feature pixels having a substantially different pixel value than other pixels in the neighborhood. If the pixels captured by fine image of feature 46 is not sufficient to resolve the feature detected by fine image of feature 46, another fine image of feature 47 is captured. The magnification of fine image of feature 47 is larger than the magnification of fine image of feature 46. Accordingly, the spot size of fine image of feature 47 is smaller than the spot size of fine image of feature 46. The fine image of feature 47 is captured by increasing the magnification or zoom of the imaging module. Also, the fine image of feature 47 is captured only for regions comprising a defect in fine image of feature 46. Further, the fine image of feature 47 is centered on a feature position computed from fine image of feature 46.

Figure 7:
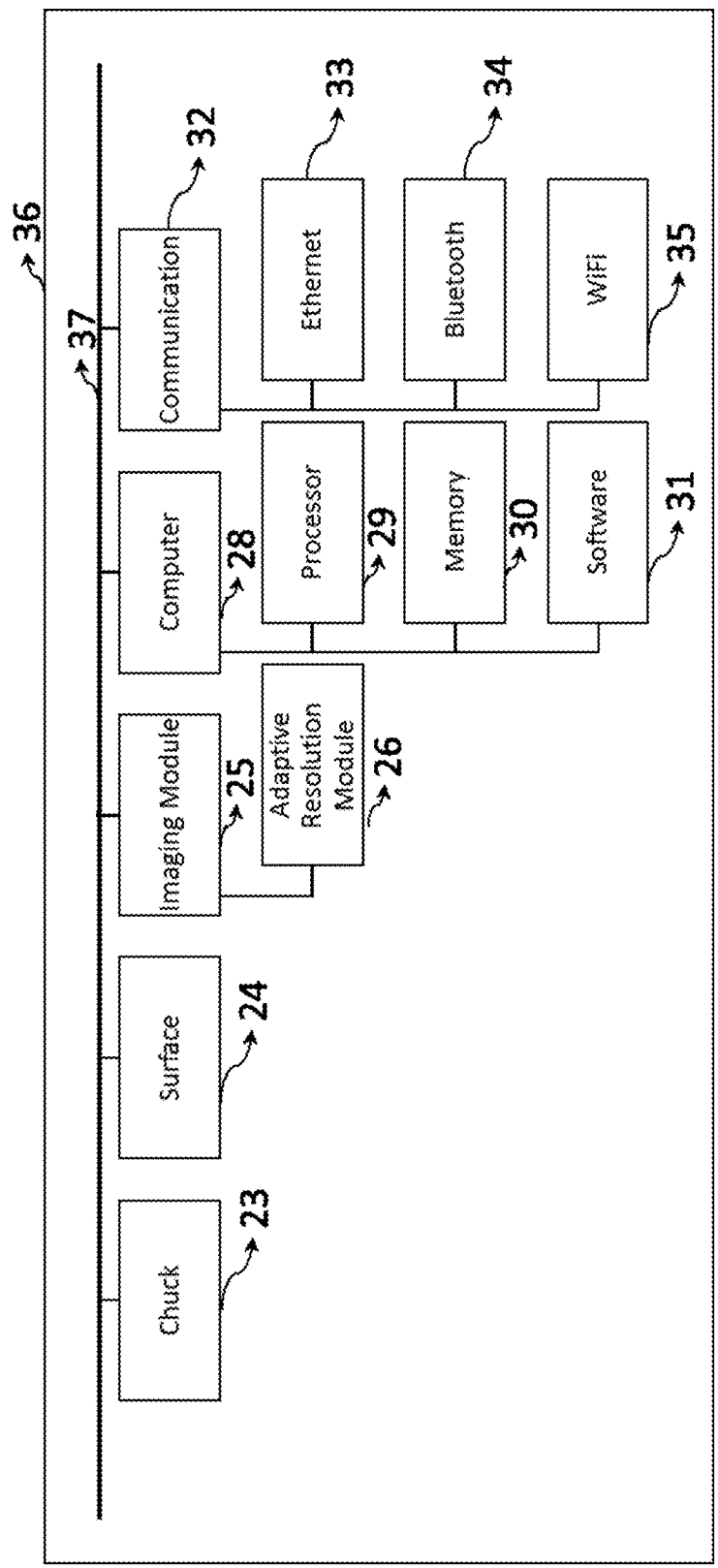
FIG. 7 depicts a block diagram of a system for generating an adaptive resolution image and estimating feature properties, in accordance with the invention.

FIG. 7 depicts a block diagram of a system for generating an adaptive resolution image and estimating feature properties, in accordance with the invention. A bus 37 connects various blocks of system 36, namely chuck 23, surface 24, imaging module 25, computer 28, and communication 32. Data and control signals are carried by bus 37. Chuck 23 includes an edge handling system that holds the edge of surface, vacuum system that holds the back side of surface with vacuum suction, gas vents, and support structures used to hold surface 24 flat. Surface 24 comprises the region to be imaged by system 36. Surface 24 may be flat, curved due to gravity induced sag, or deformed due to coatings. Imaging module 25 forms a coarse image of region and sufficient number of fine images of feature. Imaging module 25 comprises an adaptive resolution module 26. The adaptive resolution module 26 varies the spot size of imaging module to generate a coarse image of region and sufficient number of fine images of feature. In some embodiments, the adaptive resolution module 26 varies the magnification or zoom of imaging module to generate a coarse image of region and sufficient number of fine images of feature. The images captured by imaging module 25 are transferred through bus 37 to computer 28. Imaging module 25 receives control information to adjust parameters such as exposure time and gain from computer 28 through bus 37. Computer 28 includes a processor 29, memory 30, and software 31. Software 31 processes image data from imaging module 25 to compute a number of entities, including: generating an adaptive resolution image; locating feature pixels; computing edge pixels; determining the need for a fine image of feature; and feature properties such as position, size, shape, and type. Software 31 generates control information and sends them through bus 37 to chuck 23, surface 24, and imaging module 25. Computer 28 connects to communication block 32 for communicating data and control information through bus 37. Communication block 32 includes Ethernet 33, WiFi 35, and Bluetooth 34.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

It should be understood that the present invention as described above can be implemented in the form of control logic using computer software in a modular or integrated manner. Based on the disclosure and teachings provided herein, a person of ordinary skill in the art will know and appreciate other ways and/or methods to implement the present invention using hardware and a combination of hardware and software.

Any of the software components or functions described above, may be implemented as software code to be executed by a processor using any suitable computer language such as, for example, Java, C++ or Perl using, for example, conventional or object-oriented techniques. The software code may be stored as a series of instructions, or commands on a computer readable medium, such as a random access memory (RAM), a read only memory (ROM), a magnetic medium such as a hard-drive or a floppy disk, or an optical medium such as a CD-ROM. Any such computer readable medium may reside on or within a single computational apparatus, and may be present on or within different computational apparatuses within a system or network.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

The above description is illustrative and is not restrictive. Many variations of the disclosure will become apparent to those skilled in the art upon review of the disclosure. The scope of the disclosure should, therefore, be determined not with reference to the above description, but instead should be determined with reference to the pending claims along with their full scope or equivalents.

One or more features from any embodiment may be combined with one or more features of any other embodiment without departing from the scope of the disclosure. Further, modifications, additions, or omissions may be made to any embodiment without departing from the scope of the disclosure. The components of any embodiment may be integrated or separated according to particular needs without departing from the scope of the disclosure.

What is claimed is:

1. A method for calibrating an inspection system using a calibrated surface, comprising:
   capturing a calibrated dataset from said calibrated surface, with said calibrated list comprising information about features located on said calibrated surface;
   capturing an estimated list from said calibrated surface with said inspection system comprising information about features located on said calibrated surface;
   compiling a matched list by searching for the presence of one or more calibrated features in said estimated list, wherein said calibrated features are listed in said calibrated list;
   computing an estimated characteristic parameter from said matched list, wherein said estimated characteristic parameter quantifies features in said matched list having a unifying characteristic;
   computing a calibrated characteristic parameter, wherein said calibrated characteristic parameter quantifies features in said calibrated list having said unifying characteristic; and
   computing a comparison of said estimated characteristic parameter with said calibrated characteristic parameter, whereby said inspection system is calibrated to detect features with one or more unifying characteristics.

2. The method of claim 1, wherein said calibrated dataset comprises position, size, and type of one or more features.

3. The method of claim 1, wherein said features comprise particles and process induced defects.

4. The method of claim 1, wherein said estimated dataset comprises position and size of one or more features.

5. The method of claim 1, wherein said matched list comprises features in said estimated list that have substantially similar positions as features in calibrated list.

6. The method of claim 1, wherein said unifying characteristic is feature type.

7. The method of claim 1, wherein said unifying characteristic is feature size.

8. The method of claim 1, wherein said unifying characteristic is a spatial region of said calibrated surface.

9. The method of claim 1, wherein said estimated characteristic parameter is computed as the total number of features in said matched dataset having said unifying characteristic, and said calibrated characteristic parameter is computed as the total number of features in said calibrated dataset list having said unifying characteristic.

10. The method of claim 1, wherein said calibrated dataset is captured from an image of said calibrated surface, having one or more feature pixels for each feature, by estimating position, size, and type of each feature from said feature pixels.

11. A method for capturing an adaptive resolution image of a surface, comprising:
computing a coarse spot size such that weakly scattering feature is detected in an image acquired with said coarse spot size, wherein said weakly scattering feature is to be resolved by said adaptive resolution image;
capturing a coarse image of region with said coarse spot size, wherein said coarse image of region comprises one or more pixels corresponding to a predetermined region of said surface;
computing a classification of said coarse image of region into a coarse image of feature and a coarse image of surface, wherein said coarse image of feature comprises pixels in which a feature is detected and said coarse image of surface comprises pixels in which a feature is not detected;
computing an estimation of a feature position from said coarse image of feature, wherein said feature position is the location of feature on said surface;
capturing a fine image of feature at said feature position, wherein said fine image of feature is captured with a fine spot size having a smaller spot size than said coarse spot size; and
computing a combination of said fine image of feature and said coarse image of surface to generate said adaptive resolution image,
whereby feature regions are captured with finer resolution than featureless surface regions in said adaptive resolution image.

12. The method of claim 11, wherein said weakly scattering feature is the smallest feature size to be resolved by said adaptive resolution image.

13. The method of claim 11, further comprising computing of the number of pixels sampling a feature to determine the need for capturing of a fine image of feature.

14. The method of claim 11, wherein said computing a classification comprises searching for an edge pixel, in said coarse image of region, having a substantially different value than other pixels in the neighborhood; classifying said coarse image of region with one or more edge pixels as said coarse image of feature; and classifying said coarse image of region with no edge pixels as said coarse image of surface.

15. The method of claim 11, wherein said computing a combination comprises interpolating said coarse image of surface to generate an interpolated image of surface; and stitching said interpolated image of surface with said fine image of feature.

16. The method of claim 11, further comprising using said fine image of feature as said coarse image of feature; repeating said computing a classification, said computing an estimation, said capturing a fine image of feature with said fine spot size smaller than a previous fine spot size, and said computing a combination, either until a predetermined sampling criterion is met, or until said previous spot size is less than or equal to a predetermined spot threshold.

17. A system for capturing an adaptive resolution image of a surface, comprising:
a weakly scattering feature to be resolved by said adaptive resolution image;
a processor configured to
compute coarse spot size such that a weakly scattering feature is detected in an image acquired with a coarse spot size, wherein said weakly scattering feature is to be resolved by said adaptive resolution image;
a coarse imaging module to capture a coarse image of region with said coarse spot size, wherein said coarse image of region comprises one or more pixels corresponding to a predetermined region of said surface;
a processor configured to:
compute a classification of said coarse image of region into a coarse image of feature and a coarse image of surface, wherein a feature is detected in said coarse image of feature and a feature is not detected in said coarse image of surface;
compute an estimation of a feature position from said coarse image of feature, wherein said feature position is the location of feature on said surface;
a fine imaging module to capture a fine image of feature at said feature position, wherein said fine image of feature is captured with a fine spot size having a smaller spot size than said coarse spot size; and
a processor configured to compute a combination of said fine image of feature and said coarse image of surface to generate an adaptive resolution image,
whereby feature regions are captured with finer resolution than featureless surface regions in said adaptive resolution image.

18. The system of claim 17, further comprising means for repositioning said surface relative to said coarse imaging module and said fine imaging module; capturing said adaptive resolution image at multiple positions of said surface; and capturing a wide field adaptive resolution image by stitching adaptive resolution images captured at multiple positions of surface.

19. The system of claim 17, wherein said coarse imaging module is an electron microscope with said coarse spot size and said fine imaging module is an electron microscope with said fine spot size.

20. The system of claim 17, wherein said coarse imaging module is configured to capture a low magnification image with a two dimensional image sensor; and said fine imaging module is configured to capture a high magnification image with a two dimensional image sensor.

* * * * *